United States Patent [19]

Garrett

[11] 3,727,079

[45] Apr. 10, 1973

[54] ZERO CROSSING DETECTING CIRCUIT

[75] Inventor: B. Charles Garrett, Sepulveda, Calif.

[73] Assignee: Ampex Corporation, Redwood City, Calif.

[22] Filed: Dec. 6, 1971

[21] Appl. No.: 204,817

[52] U.S. Cl. .......... 307/235, 328/150

[51] Int. Cl. .......... H03k 5/00

[58] Field of Search .......... 307/232–235; 328/115–117, 150

[56] References Cited

UNITED STATES PATENTS 3,283,255 11/1966 Cogar .......... 307/235 X 3,125,691 3/1964 Astheimer .......... 307/273 X

*Primary Examiner*—John Zazworsky

*Attorney*—Robert G. Clay

[57] ABSTRACT

A circuit is provided for detecting each zero crossing of a data signal without interference from noise during a data detecting or decoding operation. The zero crossing detecting circuit determines the occurrence of each zero crossing of the data signal by constantly comparing the data signal with a reference level such as ground. A bistable latch responds to each occurrence of a zero crossing of the data signal to change state and to thereby generate a pulse denoting the occurrence of the zero crossing. The pulse which is of selected duration is applied to logic circuitry to prevent the latch from changing state in response to a succession of immediately following noise-produced zero crossings.

11 Claims, 11 Drawing Figures

INVENTOR.
B. CHARLES GARRETT

BY Robert G. Clay

ATTORNEYS

INVENTOR.
B. CHARLES GARRETT
BY Robert G. Clay
ATTORNEYS

ZERO CROSSING DETECTING CIRCUIT

BACKGROUND OF THE INVENTION

1. Field of the Invention

The present invention relates to data processing equipment, and more particularly to arrangements for detecting zero crossings in a processed data signal so as to determine the digital data represented by such signal.

2. History of the Prior Art

It has become common in the data processing field to provide arrangements which encode various binary bits of information in the form of a data signal. The data signal may be stored, transmitted or otherwise processed and thereafter decoded as appropriate so as to retrieve the data bits contained therein. Data carried by the signal is retrieved or detected using various different detection schemes which depend on the type of encoding employed. In the case of certain types of encoding, data may be represented by the presence or absence of absolute signal levels within the data signal. In still other arrangements such as those which employ phase encoding techniques, for example, data is represented by zero crossings of the data signal.

In those arrangements in which the binary data is represented by zero crossings of the data signal, it is necessary during decoding of the data signal to provide circuitry for identifying each such zero crossing of the data signal. The identifications are thereafter processed in appropriate fashion to determine whether the zero crossing represents a "one," a "zero" or no data at all.

One problem which is often present in the detection of zero crossings of a data signal results from high frequency noise which is superimposed on or otherwise intermingled with the data signal such as where the signal has been stored on a magnetic medium. Such high frequency noise presents numerous zero crossings in the vicinity of each actual zero crossing of the data signal itself. Thus whereas the data signal may have but a single zero crossing at a particular location along the length of a bit interval thereof, the presence of high frequency noise may result in the detection of several zero crossings in the vicinity of and in addition to the single zero crossing of the data signal. The detection of such additional zero crossings usually results in the inability to detect data accurately.

One prior art circuit for detecting each zero crossing of a data signal to the exclusion of closely spaced zero crossings which result from noise utilizes a Schmitt trigger. Unfortunately systems of this type tend to solve such problems at the expense of introducing other problems including the need for relatively complex and expensive circuitry and the displacement of the zero crossing detection from the zero crossing itself due to hysteresis problems.

Accordingly it is an object of the present invention to provide an improved digital data detection system.

A further object of the present invention is the provision of a circuit for detecting the zero crossings of a data signal to the exclusion of zero crossings produced by noise.

A still further object of the invention is the provision of a relatively simple and inexpensive circuit for reliably detecting the zero crossings of a data signal.

BRIEF DESCRIPTION OF THE INVENTION

Briefly, the present invention provides a circuit for detecting the zero crossings of a data signal without interference from zero crossings produced by noise. Such detecting circuits which are of relatively simple and inexpensive construction exclude unwanted noise-produced zero crossing indications by generating a pulse of selected duration in response to the first indication of a zero crossing of the data signal. The pulse comprises a signal representation of the data signal zero crossing which is used to identify a particular binary bit or the absence thereof within the data signal as well as to operate additional circuitry used in the identification of the zero crossings. In addition each such pulse comprises an inhibit signal used to prevent the detection of subsequent noise-produced zero crossings which occur during the duration of the pulse and prior to the time when the next legitimate or data-produced zero crossing is expected.

In one preferred embodiment of a zero crossing detecting circuit in accordance with the invention of a read head is used to sense the data signal in the form of a magnetic recording. The output of the read head is differentiated to reproduce the data signal as recorded on the magnetic medium. The data signal so produced is compared with a reference signal representing the zero level of the data signal so as to produce a bilevel signal which changes level upon the occurrence of each zero crossing. The output of the comparator which performs this function is coupled through logic circuitry to a bistable latch. The latch responds to each detected zero crossing by changing state so as to provide true and complementary representations of the data signal and so as to provide the generation of a pulse by an associated pulse generator. The true and complementary representations of the data signal are used by associated circuitry within the data detection system. The pulses in addition to providing data and timing information are utilized as inhibit pulses by being applied to the logic circuitry coupled between the comparator and the bistable latch. Whenever a pulse is present the logic circuitry responds to prevent the latch from changing state. Accordingly upon detecting a zero crossing of the data signal the bistable latch is thereafter prevented from undergoing a further change in state such as may result from the zero crossings of noise intermixed with the data signal.

BRIEF DESCRIPTION OF THE DRAWINGS

The foregoing and other objects, features and advantages of the invention will be apparent from the following more particular description of a preferred embodiment of the invention, as illustrated in the accompanying drawings, in which.

DETAILED DESCRIPTION

Figures 1, 3A, 3B, 3C, 3D, 3E, 3F, 3G, 3H, 3I:
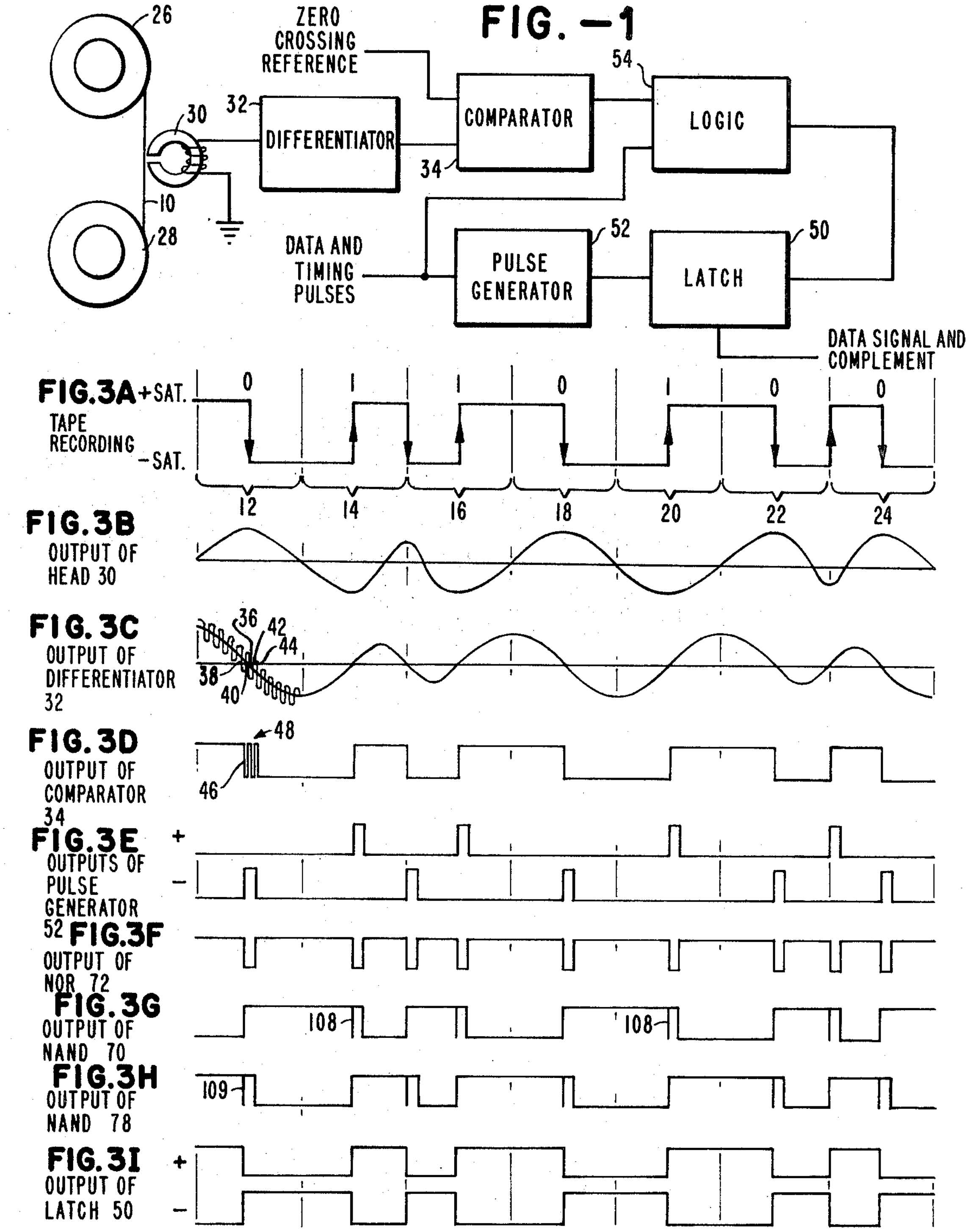
FIG. 1 is a block diagram of one preferred arrangement of a zero crossing detecting circuit in accordance with the invention.
FIGS. 3A–3I are waveforms useful in explaining the operation of the arrangements of FIGS. 1 and 2.

The particular arrangement shown in FIG. 1 facilitates the detection of data stored on a magnetic tape 10 by detecting zero crossings of the data signal in the form of a magnetic recording on the tape 10. The stored data may be encoded on the tape 10 in any appropriate fashion such as by use of phase encoding techniques as shown in FIG. 3A. The particular waveform of FIG. 3A represents a magnetic recording on the tape comprising transitions between opposite positive and negative levels of magnetic saturation. The length of the magnetic recording is arbitrarily divided into a succession of bit cell intervals of generally equal length; seven such intervals 12, 14, 16, 18, 20, 22 and 24 being shown in FIG. 3. In the case of the phase encoding depicted in FIG. 3A the magnetic recording comprises a transition through zero at the center of each bit interval as well as a transition at the leading edge of selected intervals. The sense or direction of the zero crossings at the centers of the various bit intervals represent the data stored therein. Thus a negative-going transition through zero represents "zero" as in the case of the intervals 12, 18, 22 and 24. On the other hand a positive-going transition through zero represents binary "one" as in the case of the bit intervals 14, 16 and 20. The transitions at the leading edges of the bit intervals 16 and 24 are necessary reversals in the polarity of the recording so that transitions of the same sense can occur at the centers of successive bit intervals representing the same binary value.

The magnetic tape 10 shown in FIG. 1 is advanced between supply and takeup reels 26 and 28 past a magnetic read head 30. The head 30 responds to the relative movement of the tape 10 so as to differentiate the magnetic recording in well known fashion. The differentiated signal at the head 30 resulting from the magnetic recording of FIG. 3A is illustrated in FIG. 3B. As is well known in the art the zero crossings of the magnetic recording may be restored by differentiating the signal sensed by the read head. Accordingly a differentiator 32 is coupled to the output of the read head 30 to reproduce the data signal as shown in FIG. 3C.

It should be understood by those skilled in the art that the invention is herein described in terms of the detection of data stored on a magnetic medium for purposes of illustration only. In actual practice the circuit of the invention may be used in conjunction with the detection of data which has been stored using other conventional techniques and data which has not been stored at all but which has been encoded for purposes of communication thereof. It will also be understood by those skilled in the art that phase encoding is described herein for purposes of illustration only, and that other types of encoding which utilize the zero crossings of a data signal or signals to represent information can be used in accordance with the invention.

The data signal as provided by the differentiator 32 is compared in a comparator 34 with a zero crossing reference signal. The zero crossing reference signal which typically comprises electrical ground represents the signal level or value at which the data signal is understood to undergo a "zero" crossing. The comparator 34 is such as to produce a change in its bilevel output each time the data signal equals the zero crossing reference. The resulting output of the comparator 34 which varies between zero and a positive value is illustrated in FIG. 3D.

The comparator output signal shown in FIG. 3D assumes that the data signal at the output of the differentiator 32 is generally free of noise. However as shown within the first bit interval 12 of FIG. 3C the data signal frequently has high frequency noise intermixed with or superimposed thereon. Moreover while the data signal itself has a zero crossing at a point 36 midway along the length of the bit interval 12, the high frequency noise itself has several zero crossings within the bit interval 12. Two such zero crossings 38 and 40 occur immediately before the zero crossing 36. Zero crossings 42 and 44 which are also produced by the noise immediately follow the zero crossing 36. The first such zero crossing 38 within the bit interval 12 produces a negative-going transition 46 at the output of the comparator 34. The following zero crossings 40, 36, 42 and 44 result in subsequent transitions 48 at the output of the comparator 34 as seen in FIG. 3D. For convenience of illustration the noise signal and the resulting output transitions of the comparator 34 are shown only within the bit interval 12 in FIGS. 3C and 3D. However, in actual practice the noise and resulting multiple transitions of the comparator 34 output can result continuously or randomly along the entire length of the data signal throughout the various bit intervals.

The output of the comparator 34 may be used to change the state of a bistable circuit such as a flip-flop or latch to denote the zero crossings of the data signal. However in the absence of an inhibit function as provided by the invention such bistable circuit would change state in response to each of the transitions 48 at the output of the comparator 34 as well as in response to the first such transition 46. This would cause the bistable circuit to falsely denote the presence of as many as five different zero crossings within the bit interval 12 when in fact only one such crossing is present in the data signal itself. In accordance with the invention the first such transition 46 at the output of the comparator 34 is employed to change the state of a bistable latch 50 and to produce a pulse via a pulse generator 52. The pulse so produced is applied to logic circuitry 54 coupled between the comparator 34 and the latch 50 to inhibit the circuit and prevent the latch 50 from changing state in response to the transitions 48 at the output of the comparator 34. The circuit remains inhibited during the duration of the pulse produced by the generator 52. Accordingly the width of pulses produced by the generator 52 is selectively chosen so as to inhibit the circuit during the occurrence of those zero crossings which immediately follow the first zero crossing. By allowing the system to respond to the first zero crossing such as the crossing 38 in the case of the bit interval 12, the system typically responds to a noise produced zero crossing rather than a data signal produced zero crossing. However in actual practice it has been found that the first zero crossing typically precedes the zero crossing of the data signal by no more than 3 percent of the total length of the bit interval. The zero crossing indications so produced in accordance with the invention are accordingly displaced from their desired time positions by only a very small amount which does not produce errors in the detection system.

Figure 2:
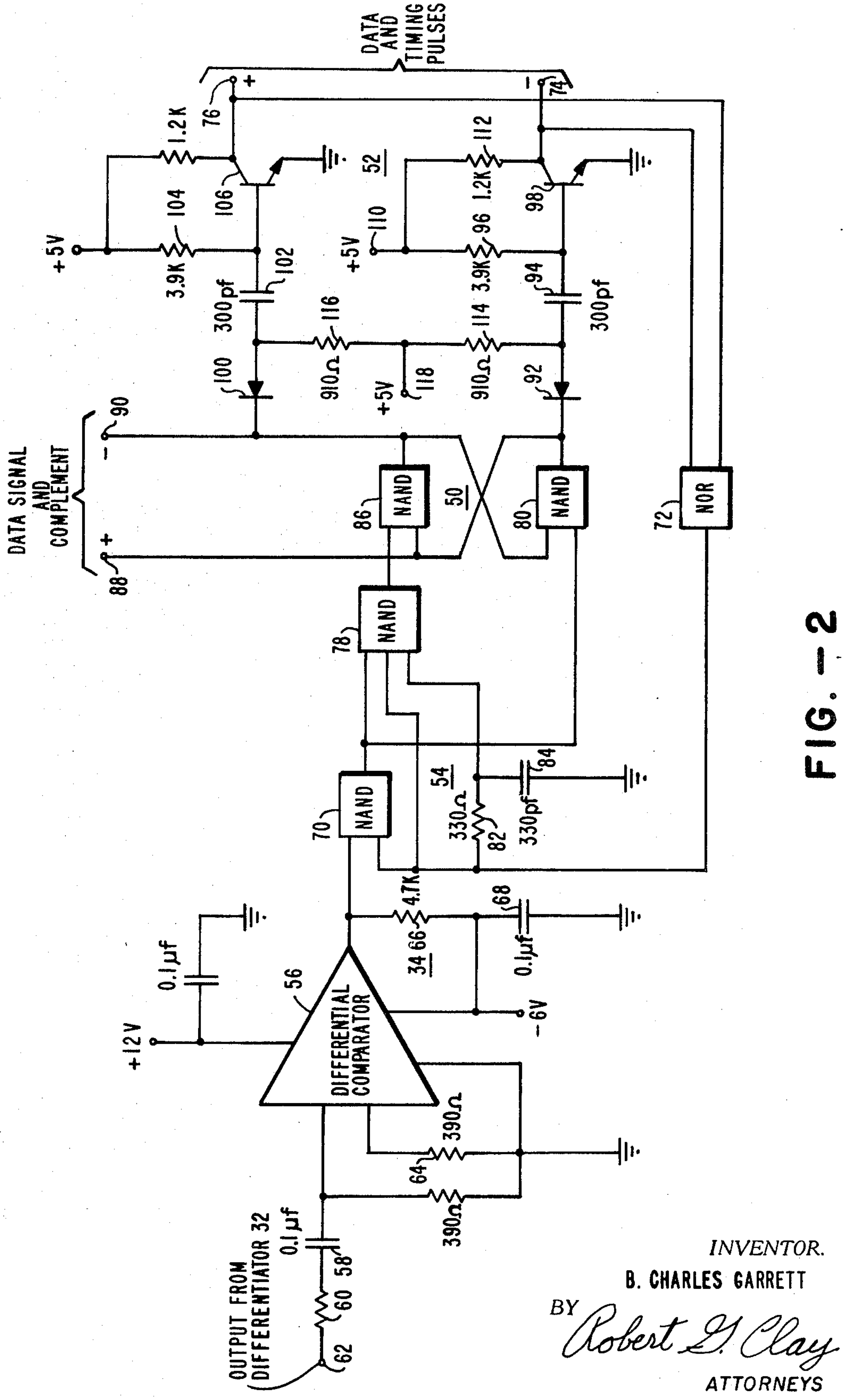
FIG. 2 is a schematic diagram of one preferred circuit for use in the arrangement of FIG. 1 in accordance with the invention.

As discussed hereafter in connection with FIG. 2 the pulse generator 52 produces two different trains of pulses as shown in FIG. 3E. The first such train of pulses represents "one" bits while the second train represents "zero" bits as well as transitions occurring at the leading edges of the bit intervals. Such pulses are accordingly utilized by additional circuitry within the data detection system both as actual representations of the data bits and as reference signals such as to provide phase synchronization of such additional circuitry. One example of the manner in which such pulses are utilized other than to denote data is provided by the circuit described in a copending application of B. Charles Garrett, Ser. No. 205,076, filed Dec. 6, 1971, entitled "INTEGRATING LEVEL SENSING CIRCUIT," and commonly assigned with the present application. As described in that application pulses such as those produced by the pulse generator 52 are used by integrating and ramp generating circuitry to determine the commencement of each half cycle of the data signal.

The various pulses at the output of the generator 52 also comprise inhibit pulses which prevent unwanted switching of the latch 50 in response to the zero crossings following the first such crossing as described hereafter in connection with FIG. 2.

By changing state in response to each zero crossing of the data signal the latch 50 provides at a pair of outputs thereof true and complementary representations of the data signal itself as seen in FIG. 3I. The true and complementary representations are used by the additional circuitry in the data detection system. For example as described in the previously referred to application, Ser. No. 205,076, the true and complementary representations of the data signal are used by output logic within associated level detection circuitry to form output pulses.

One preferred circuit for use in the arrangement of FIG. 1 is schematically illustrated in FIG. 2. As shown in FIG. 2 the comparator 34 includes a differential comparator 56 coupled to various power supply terminals and to ground through an appropriate arrangement of resistors and capacitors. One input of the differential comparator which may comprise a circuit sold under the designation "$\mu$A710C Dual Inline Package" by Fairchild Semiconductor Co. is coupled through a capacitor 58 and resistor 60 to an input terminal 62 which receives the data signal from the differentiator 32. The other input of the comparator 56 is coupled through a resistor 64 to ground to provide the zero crossing reference. The output of the differential comparator 56 which is coupled to a negative power supply terminal of −6 volts through a resistor 66 varies between a positive voltage and ground to provide the bilevel output shown in FIG. 3D. A capacitor 68 is coupled between the negative power supply terminal and ground to provide filtering.

The logic circuitry 54 includes a first NAND gate 70 having a first input thereof coupled to the output of the differential comparator 56 and a second input thereof coupled to the output of a NOR gate 72. The NOR gate 72 has two different inputs respectively coupled to two different output terminals 74 and 76 of the pulse generator 52. The output of the NAND gate 70 is coupled as one of the inputs to a NAND gate 78 within the logic circuitry 54 as well as one of the inputs of a NAND gate 80 comprising part of the latch 50. The output of the NOR gate 72 is coupled directly as a second input of the NAND gate 78 and through a resistor 82 to a third input of the NAND gate 78. The end of the resistor 82 adjacent the NAND gate 78 is coupled through a capacitor 84 to ground. The output of the NAND gate 78 is coupled as one of the inputs of a NAND gate 86 within the latch 50. The NAND gates 80 and 86 comprising the latch 50 are cross-coupled in appropriate fashion such that the output of each one comprises a second input of the other. The output of the NAND gate 80 provides the true representation of the data signal at a terminal 88. The output of the NAND gate 86 provides the complementary representation of the data signal at a terminal 90.

The output of the NAND gate 80 is also coupled through a diode 92 to an RC circuit comprising a capacitor 94 and a resistor 96 which are coupled to control the conduction of a transistor 98. The transistor 98 which comprises a first pulse generator within the pulse generator 52 is coupled to the output terminal 74. Likewise the output of the NAND gate 86 within the latch 50 is coupled through a diode 100 to an RC circuit comprising a capacitor 102 and a resistor 104 which control the conduction of a transistor 106 coupled to the output terminal 76 within a second pulse generator in the pulse generator 52.

To understand the operation of the circuit of FIG. 2 it must first be assumed that the pulse generator 52 produces the trains of pulses shown in FIG. 3E at its output terminals 76 and 74 respectively. Application of these trains of pulses to the NOR gate 72 results in the signal shown in FIG. 3F which is of high value except when a pulse occurs to provide it with zero value. Accordingly the NOR gate 72 enables the lower input of the NAND gate 70 and the lower two inputs of the NAND gate 78 except during the occurrence of a pulse at either of the outputs 74 and 76 of the pulse generator 52. The NAND gate 70 combines the output of the NOR gate 72 with the output of the differential comparator 56 to provide the signal shown in FIG. 3G. It will be noted from FIG. 3G that the output of the NAND gate 70 responds to the leading edge of one pulse at the output of the NOR gate 72 to rise from zero to its upper level and to the trailing edge of the immediately following pulse at the output of the NOR gate 72 to fall back to zero. A very narrow spike 108 occurs shortly prior to each negative-going transition in the output of the NAND gate 70 as seen in FIG. 3G. The spikes 108 result from the fact that the NAND gate 70 momentarily has both inputs high at each positive-going transition of the comparator 34 output. However the circuit quickly reacts to produce a pulse at the output of the pulse generator 52 so as to lower the output of the NOR gate 72 and thus immediately raise the output of the NAND gate 70 to its high level.

As previously noted the output of the NAND gate 70 is applied as one of the inputs of the NAND gate 78. The other two inputs of the NAND gate 78 comprise the output of the NOR gate 72 applied both directly and through the resistor 82. The resulting output of the NAND gate 78 is shown in FIG. 3H. As in the case of the NAND gate 70 the NAND gate 78 experiences a negative-going transition at the trailing edge of alternate pulses in the output of the NOR gate 72 and a positive-going transition at the leading edge of the other pulses in the output of the NOR gate 72.

The outputs of the NAND gates 70 and 78 are applied as inputs to the latch 50 by being respectively coupled to the NAND gates 80 and 86. The outputs of the NAND gates 80 and 86 which respectively comprise the true and complementary representations of the data signal are shown in FIG. 3I. It will be noted that during the first half of the bit interval 12 the outputs of the NAND gates 70 and 86 are both low. Accordingly the output of the NAND gate 80 is high. This combines with the high output of the NAND gate 78 to produce the low output at the NAND gate 86. The negative-going transition 46 appears at the output of the comparator 34 just prior to the center of the bit interval 12. The resulting low input to the NAND gate 70 combines with the low output of the NOR gate 72 to produce a high output at the NAND gate 70. The high output of the NAND gate 70 combines with the now low output of the NOR gate 72 to continue to provide the NAND gate 78 with a high output. This does not occur, however, before the output of the NAND gate 78 momentarily drops in response to the rising output of the NAND gate 70 to produce a spike 109 similar to the spikes 108 in the output of the NAND gate 70. The high output of the NAND gate 78 combines with the output of the NAND gate 80 which decreases to zero to increase the output of the NAND gate 86 to its high level. At the same time the increasing output of the NAND gate 86 combines with the increasing output of the NAND gate 70 to decrease the output of the NAND gate 80 to zero.

As the output of the NAND gate 80 drops to ground level the base bias on the transistor 98 decreases to a level sufficient to turn off the transistor 98. With the transistor 98 turned off current flows from a positive power supply terminal 110 through a resistor 112 to the output terminal 74 and to the associated input of the NOR gate 72. The duration of this current which comprises one of the data and timing pulses is determined by the RC circuit consisting of the capacitor 94 and the resistor 96. After a selected period of time on the order of one-tenth the length of a bit interval in the present example the capacitor 94 is discharged sufficiently to turn on the transistor 98 and terminate the pulse. The other half of the pulse generator 52 which includes the diode 100, the capacitor 102, the resistor 104 and the transistor 106 responds in similar fashion to a drop in the output of the NAND gate 86 to turn the transistor 106 off for the selected period of time to produce a pulse at the output terminal 76. The diodes 92 and 100 allow the NAND gates 80 and 86 to switch rapidly and provide some temperature compensation for the base emitter junctions of the transistors 98 and 106. A pair of resistors 114 and 116 respectively coupled between the capacitors 94 and 102 and a positive power supply terminal 118 serve to recharge the capacitors 94 and 102.

The logic circuitry 54 responds to each zero crossing as detected by the comparator 34 to change the state of the latch 50 and produce an output pulse at the pulse generator 52 as described. Each pulse is applied via the NOR gate 72 to prevent the latch 50 from being switched in response to noise produced zero crossings which immediately follow the first such zero crossing detected by the comparator 34.

When the output of the comparator 34 rises from zero to the high value as at the center of the bit interval 14, the output of the NAND gate 70 momentarily decreases and then quickly increases in response to the low output of the NOR gate 72 to produce one of the spikes 108. The high output of the NAND gate 70 combines with the two low inputs provided the NAND gate 78 by the NOR gate 72 to produce a high output at the NAND gate 78. The combined outputs of the NAND gates 70 and 78 produce high and low outputs at the NAND gates 80 and 86 respectively. As previously noted the decrease in the output of the NAND gate 86 to zero momentarily turns off the transistor 106 to produce a pulse at the terminal 76. This pulse results in a low output from the NOR gate 72 being applied to the two associated inputs of the NAND gate 78. When the pulse at the terminal 76 terminates, the output of the NOR gate 72 again becomes high so as to decrease the output of the NAND gate 70 to zero and raise the two inputs to the NAND gate 78 from the NOR gate 72 to high values. When the pulse at the input of the NOR gate 72 terminates, the resulting increase in the output of the NOR gate 72 to a high value is communicated almost instantaneously to the two lower inputs of the NAND gate 78. A longer time is typically required however for the NAND gate 70 to react to the increase in the output of the NOR gate 72 so as to lower its output to zero. As a result all three inputs of the NAND gate 78 may be high for a very short period of time so as to produce a low output at the NAND gate 78 and switch the latch 50. To prevent this from occurring the resistor 82 and capacitor 84 are coupled in circuit with one of the inputs of the NAND gate 78. The resistor 82 and capacitor 84 delay the application of the high output from the NOR gate 72 to the associated input of the NAND gate 78 for a period of time long enough to allow the output of the NAND gate 78 to drop to zero in response to the increase in the NOR gate 72 output.

While the invention has been particularly shown and described with reference to a preferred embodiment thereof, it will be understood by those skilled in the art that various changes in form and details may be made therein without departing from the spirit and scope of the invention.

What is claimed is:

1. In a digital data detection system in which zero crossings of a data signal are detected and a bistable device is normally switched in response to each detection of a zero crossing to provide a representation of the data signal, the improvement comprising means responsive to each zero crossing of the representation of the data signal as denoted by switching of the bistable device for producing an output signal of selected duration, and means responsive to each output signal for preventing switching of the bistable device during the duration of the output signal.

2. The invention defined in claim 1, wherein the duration of each output signal is chosen so as to encompass zero crossings produced by high frequency noise signals superimposed on the data signal.

3. The invention defined in claim 2, wherein the data signal comprises a phase encoded signal, and each output signal has a duration approximately equal to one-tenth the length of a bit interval of the data signal.

4. An arrangement for detecting zero crossings of a data signal comprising:
means responsive to the data signal for providing an indication upon the occurrence of each zero crossing in the data signal;
bistable means;
logic means coupled to the bistable means and operative to change the state of the bistable means in response to each zero crossing indication except when inhibited;
pulse generating means coupled to the bistable means for generating a pulse in response to each change of state of the bistable means; and
means coupling the pulse generating means to the logic means to inhibit the logic means in response to each generated pulse.

5. The invention defined in claim 4, wherein the logic means comprises first and second logical elements intercoupled to provide alternate outputs in response to each zero crossing indication when enabled, and means for enabling the first and second logical elements except during the occurrence of a generated pulse.

6. The invention defined in claim 5, wherein the enabling means includes means for delaying the enabling of the second logical element for a selected period of time after termination of a generated pulse.

7. The invention defined in claim 5, wherein the bistable means comprises third and fourth logical elements cross-coupled with one another to provide alternate outputs and responsive to the outputs of respective ones of the first and second logical elements.

8. The invention defined in claim 7, wherein the data signal is divided into successive bit intervals, and the pulse generating means includes means responsive to a change in the output of either of the third and fourth logical elements for generating a pulse having a width bearing a selected relation to the length of the bit intervals.

9. A circuit for detecting zero crossings of a data signal comprising:
comparator means for comparing the data signal to a zero crossing reference to produce a change in the bilevel output thereof each time the data signal equals the zero crossing reference;
a latching circuit comprising first and second NAND circuits cross-coupled such that the output of each is coupled as an input to the other;
pulse generating means coupled to the outputs of the first and second NAND circuits and operative to generate a pulse of predetermined duration each time one of the outputs of the first and second NAND circuits changes in a given sense;
means coupled to the pulse generating means for providing an enabling signal at an output thereof except during the generation of a pulse;
a third NAND circuit having inputs coupled to the outputs of the comparator means and the enabling signal means and an output coupled as an input of the first NAND circuit; and
a fourth NAND circuit having inputs coupled to the outputs of the third NAND circuit and the enabling signal means and an output coupled as an input of the second NAND circuit.

10. The invention defined in claim 9, wherein the pulse generating means comprises a pair of pulse generators, each being responsive to the output of a different one of the first and second NAND circuits, and the enabling signal means comprises a NOR circuit having separate inputs coupled to the outputs of the pair of pulse generators.

11. The invention defined in claim 10, wherein each of the pair of pulse generators comprises a normally conducting transistor which is coupled to be biased into non-conduction upon change of the output of the associated one of the first and second NAND circuits in the given sense, and a resistor-capacitor circuit coupled to the transistor for maintaining non-conduction of the transistor for a period of time equal to the predetermined pulse duration.

* * * * *